United States Patent
Webb et al.

(10) Patent No.: US 7,728,649 B1
(45) Date of Patent: Jun. 1, 2010

(54) LEAKAGE CURRENT CANCELLATION FOR INTEGRATED ANALOG SWITCH

(75) Inventors: Robert W. Webb, Palm Bay, FL (US); Gregg D. Croft, Palm Bay, FL (US)

(73) Assignee: Intersil Americas Inc., Milpitas, CA (US)

( * ) Notice: Subject to any disclaimer, the term of this patent is extended or adjusted under 35 U.S.C. 154(b) by 21 days.

(21) Appl. No.: 12/261,087

(22) Filed: Oct. 30, 2008

Related U.S. Application Data (60) Provisional application No. 60/984,490, filed on Nov. 1, 2007.

(51) Int. Cl.
*H03K 3/01* (2006.01)
(52) U.S. Cl. .................................. 327/534; 327/404
(58) Field of Classification Search ............. 327/379, 327/403, 404, 427, 534, 535, 537
See application file for complete search history.

(56) References Cited

U.S. PATENT DOCUMENTS

| | | | | |
|---|---|---|---|---|
| 5,594,381 A | * | 1/1997 | Bingham | 327/534 |
| 6,194,952 B1 | * | 2/2001 | Shigehara | 327/534 |
| 6,828,846 B2 | * | 12/2004 | Tsukazaki et al. | 327/404 |
| 6,847,249 B1 | * | 1/2005 | Brokaw | 327/408 |
| 7,521,984 B2 | * | 4/2009 | Ricotti | 327/427 |

OTHER PUBLICATIONS

"HA-2600 Data Sheet." Intersil. Jan. 16, 2006. FN2902.7. pp. 1-9.
"HA-5170 Data Sheet." Intersil. Nov. 2004. FN2912.5 pp. 1-9.

* cited by examiner

*Primary Examiner*—Hai L Nguyen
(74) *Attorney, Agent, or Firm*—Gary R. Stanford (57) ABSTRACT

An integrated analog switch including first and second semiconductor devices and a current mirror. The first device is a switching device having first and second current terminals coupled between first and second switch terminals. When turned off, the body of the first device is pulled to a bias voltage, and a first leakage current flows between its body and the first switch terminal. The second device is a reduced-size replica of the first device having one current terminal coupled to the first switch terminal and having its body pulled to about the bias voltage when turned off. The second device provides a second leakage current which is proportional to the leakage current of the first device. The current mirror circuit mirrors and amplifies the second leakage current to provide a cancellation current which is applied to the first switch terminal to cancel leakage current.

21 Claims, 4 Drawing Sheets

LEAKAGE CURRENT CANCELLATION FOR INTEGRATED ANALOG SWITCH

CROSS-REFERENCE TO RELATED APPLICATIONS

This application claims the benefit of U.S. Provisional Application Ser. No. 60/984,490, filed on Nov. 1, 2007, which is herein incorporated by reference for all intents and purposes.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Analog switches are typically formed using an arrangement of N-channel and P-channel metal-oxide semiconductor, field-effect transistor (MOSFET) devices coupled in parallel. When the analog switch is turned off, many conventional configurations leak current between the switched terminals. It is desired to reduce the amount of leakage current in the off-state of an analog switch.

Figure 1:
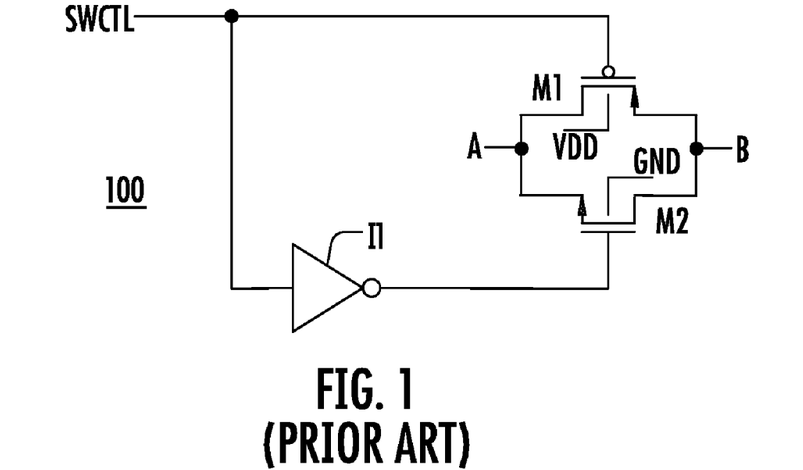
FIG. 1 is a schematic diagram of a conventional basic CMOS switch implemented according to prior art.

FIG. 1 is a schematic diagram of a conventional basic CMOS switch 100 implemented according to prior art. The CMOS switch 100 includes a P-channel device M1 having its bulk or body coupled to a first power supply rail VDD and an N-channel device M2 having its body coupled to a second power supply rail GND (ground). In the illustrated embodiment, the CMOS switch 100 is an integrated switch manufactured using a complementary metal oxide semiconductor (CMOS) process in which M1 is a P-channel MOS (PMOS) device and M2 is an N-channel MOS (NMOS) device. The PMOS and NMOS devices are shown using the conventional symbol including a source with an arrow to differentiate the source from the drain. In many configurations the drain is extended so that the devices are somewhat asymmetrical. In one embodiment, the PMOS and NMOS devices shown and described herein have their drains extended and have their drains and sources made with substantially the same geometries resulting in symmetrical devices. In this manner, the drains and sources of the symmetrical P-channel and N-channel devices are interchangeable from an electrical standpoint so that the actual drain and source of any given device depends upon relative voltage levels. For symmetrical or asymmetrical devices, the drain and source may alternatively be referred to as current terminals and the path between the current terminals is referred to as a current path of the semiconductor device. The gates of the N-channel and P-channel semiconductor devices are otherwise referred to as control terminals.

The source of M2 and the drain of M1 are coupled together at an input switch terminal A, and the drain of M2 and the source of M1 are coupled together at an output switch terminal B. A logic switch control signal SWCTL is provided to the input of an inverter I1 and to the gate of M1. The output of inverter I1 is coupled to the gate of M2. In this manner, M1 and M2 are the main switch elements coupled in a transmission gate configuration with their gates driven by a differential or inverted input signal. In operation of the CMOS switch 100, the SWCTL signal is pulled high to turn the CMOS switch 100 off by turning off M1 and M2. When M1 and M2 are both off, the impedance between the drains and sources of M1 and M2 significantly increases effectively isolating terminal A from terminal B. When the SWCTL signal is pulled low, M1 and M2 are both turned on causing a parallel conducting path between terminals A and B through the parallel paths of M1 and M2.

Figure 2:
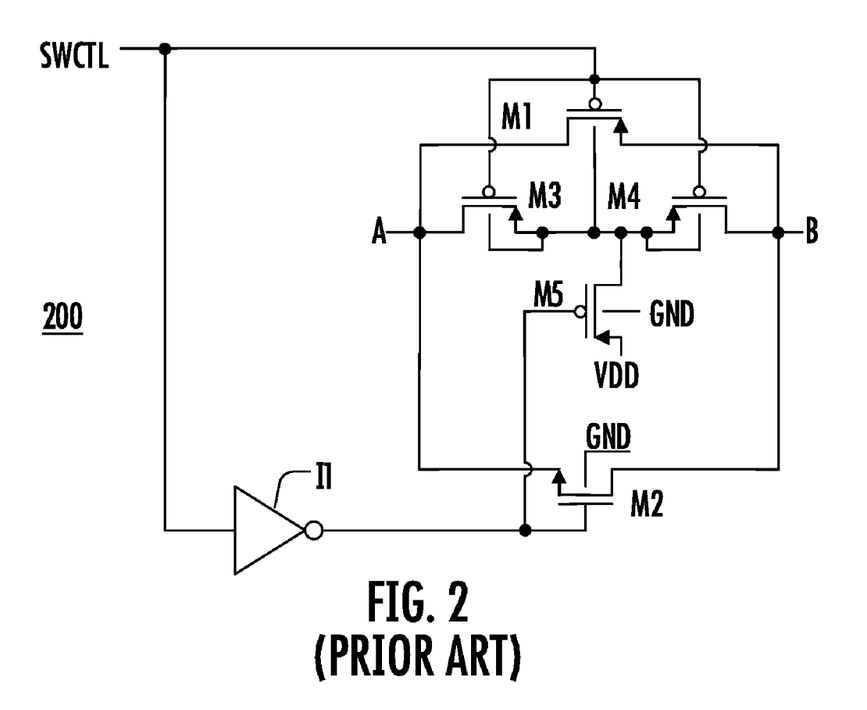
FIG. 2 is a schematic diagram of a slightly more complex conventional CMOS switch implemented according to prior art manufactured in a CMOS process that utilizes a single N doped well in a P doped substrate.

FIG. 2 is a schematic diagram of a slightly more complex conventional CMOS switch 200 implemented according to prior art. The CMOS switch 200 is manufactured in a CMOS process that utilizes a single N doped well in a P doped substrate. The PMOS device M1 and NMOS device M2 are included and coupled in similar manner as the CMOS switch 100. Again, SWCTL is coupled to the gate of M1 and to the input of the inverter I1. The output of I1 is coupled to the gate of M2. The drain of M1 is coupled to the source of M2 at terminal A and the source of M1 is coupled to the drain of M2 at terminal B. The body of M2 is coupled to GND in similar manner as the CMOS switch 100. The CMOS switch 200 includes three additional PMOS devices M3, M4 and M5. The drain of M3 is coupled to terminal A. The sources and bodies of M3 and M4 are coupled together and to the body of M1 and the drain of M5. The drain of M4 is coupled to terminal B. The gate of M2 is coupled to the output of I1 and to the gate of M5. M5 has its body coupled to GND and its source coupled to VDD. The gates of M3 and M4 are coupled to SWCTL.

The basic switching elements of the CMOS switch 200 are M1 and M2, which are controlled by applying the appropriate voltages to their gates in the same manner as described for the CMOS switch 100. The body of M2 is tied to the substrate voltage, which in this case is GND, regardless of which state the CMOS switch 200 is in. As understood by those of ordinary skill in the art, the body of the NMOS device is not separated from the substrate in the single well process so that the body may not be coupled to a different voltage than the substrate. The voltage at the body of PMOS device M1, however, varies with the state of the CMOS switch 200. This is done to improve the on and off state characteristics of the CMOS switch 200. During the on state of the CMOS switch 200 when SWCTL is low, the body of M1 is tied to the midpoint of the voltages applied to terminals A and B through conducting PMOS transistors M3 and M4. If a very low voltage drop across the CMOS switch 200 is assumed while it is on, then the drain to body diodes of M1, M3 and M4 have almost no voltage across them. This means any leakage current measured on terminals A or B in the on state is primarily due to the reversed biased drain to substrate diodes of M2 in parallel to the reversed biased NWELL to substrate diodes of M1, M3 and M4. For a typical CMOS process this substrate leakage current is normally small, even at elevated temperatures. In most CMOS switch configurations M1 and M2 are designed to be very large in order to achieve a low on resistance, whereas M3, M4, and M5 are typically much smaller in area as compared with the primary switching devices M1 and M2. Leakage currents, therefore, are typically dominated by the larger devices M1 and M2.

During the off state of the CMOS switch 200 when SWCTL is high, the devices M1, M2, M3, and M4 are turned off (e.g., non-conducting) and M5 is turned on (e.g., conducting). M5 pulls the bodies of M1, M3, and M4 up to VDD to help keep these devices in the off state. However, this reverse biases the drain to bodies of M1, M3, and M4. The leakage current on terminals A or B during the off state is the sum of all the leakage currents in these reversed biased, P+ to NWELL, drain to body diodes plus the current in the reversed biased, N+ to PSUB (substrate), drain to substrate diode of M2. This total current can be 1 or 2 orders of magnitude larger than the on state leakage current. The drain to body leakage current of the largest PMOS device, M1, is typically the dominant term in this sum.

Figure 3:
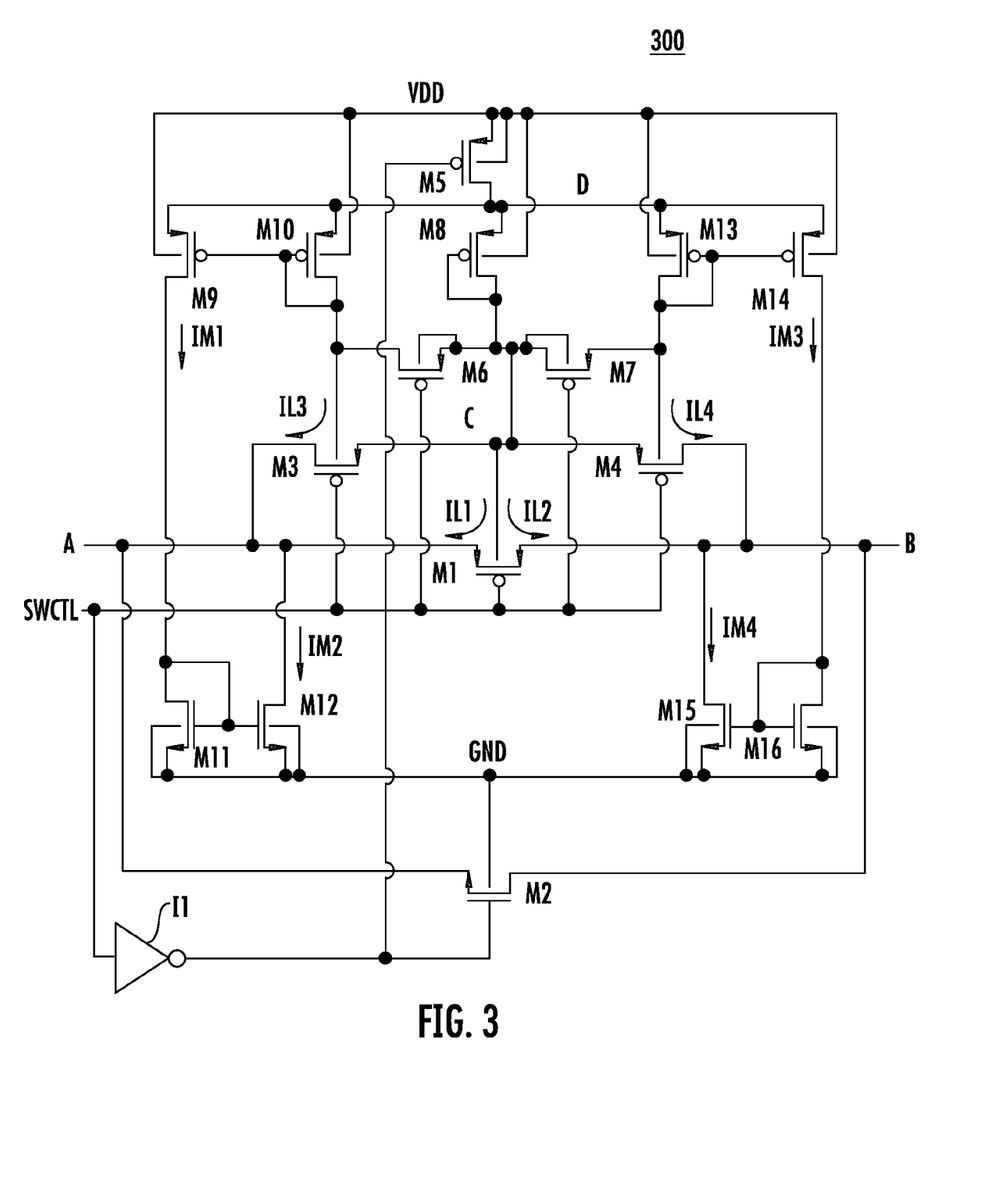
FIG. 3 is a schematic diagram of a CMOS switch implemented according to an exemplary embodiment manufactured in a CMOS process that utilizes a single N doped well in a P doped substrate.

FIG. 3 is a schematic diagram of a CMOS switch 300 implemented according to an exemplary embodiment. The devices M1-M4 are included and coupled in similar manner between switch terminals A and B as the CMOS switch 200. The M1 device is shown reversed having its source coupled to terminal A and its drain coupled to terminal B, although as previously described, the devices are symmetrical in the illustrated embodiment such that the drains and sources are interchangeable. The sources of M1 and M2 are coupled to terminal A and the drains of M1 and M2 are coupled to terminal B. The gate of M1 receives the SWCTL signal, which is provided to the input of the inverter I1. The output of the inverter I1 is coupled to the gate of M2. The body of M2 is coupled to GND and the body of M1 is coupled to the sources of M3 and M4. The drain of M3 is coupled to terminal A and the drain of M4 is coupled to terminal B. The SWCTL signal is provided to the gates of M3 and M4. M5 is included having its gate coupled to the output of the inverter I1. In this case, the body and source of M5 is coupled to VDD and the drain of M5 is coupled to an intermediate node D. The devices M1-M5 of the CMOS switch 300 perform similar functions as described for the CMOS switch 200.

The CMOS switch 300 includes additional PMOS devices M6, M7, M8, M9, M10, M13, and M14 and additional NMOS devices M11, M12, M15 and M16. The devices M6-M16 are added to perform a leakage cancellation function as described herein. Although the CMOS switch 300 is more complex than the CMOS switch 200, the actual increase in chip area is minimal due to the relatively small sizes of the additional devices. In particular, the size of the CMOS switch 300 is dominated by the relatively large sizes of the devices M1 and M2. The SWCTL signal is provided to the gates of devices M6 and M7. The source and body of M6 are coupled to the body and drain of M7 at a node C. The drain of M6 is coupled to the body of M3 and the source of M7 is coupled to the body of M4. The source of M8 is coupled to node D and the body of M8 is coupled to VDD. The gate and drain of M8 are coupled together and to node C.

The PMOS devices M9 and M10 are coupled in a current mirror configuration. In particular, the gates of M9 and M10 are coupled together and to the drain of M10, which is further coupled to the body of M3. The sources of M9 and M10 are coupled together at node D and the bodies of M9 and M10 are coupled to VDD. The NMOS devices M11 and M12 are also coupled in a current mirror configuration to the drain of M9 and terminal A. In particular, the drain of M9 is coupled to the drain of M11 and to the gates of M11 and M12. The sources and bodies of M11 and M12 are all coupled to GND. The drain of M12 is coupled to terminal A. In a similar manner, the devices PMOS M13 and M14 and the NMOS devices M15 and M16 are coupled in current mirror configurations to the node D and the terminal B. In particular, the gates of M13 and M14 are coupled together and to the drain of M13, which is further coupled to the body of M4. The sources of M13 and M14 are coupled together at node D and the bodies of M13 and M14 are coupled to VDD. The drain of M14 is coupled to the drain of M16 and to the gates of M15 and M16. The sources and bodies of M15 and M16 are all coupled to GND. The drain of M15 is coupled to terminal B.

The basic operation of the CMOS switch 300 is as follows. The CMOS switch 300 is in the on state when SWCTL is low, in which devices M1-M4, M6 and M7 are all conducting and devices M5 and M8-M16 are turned off or non-conducting. This connects the bodies of M1, M3, M4, M6, and M7 to the midpoint of the voltages applied to terminals A and B (at node C) in the same manner as is done for the CMOS switch 200. During the off state, devices M1-M4, M6, and M7 are turned off and devices M5 and M8-M16 are turned on. The body of M1 is pulled up towards VDD through M5 and M8. A first leakage current IL1 flows from the body of M1 to its source (e.g., into switch terminal A) and a second leakage current IL2 flows from its body to the drain of M1 (e.g., into switch terminal B). The leakage currents IL1 and IL2 vary independent of each other depending on the voltages applied to switch terminals A and B. The body of M3 is also pulled up to VDD through M5 and M10 causing a third leakage current IL3. The body to drain diode of M3 has almost the same voltage across it as the body to source diode of M1 because the anodes (or N-doped end) of both diodes are coupled to terminal A and the cathodes (or P-doped end) of both diodes are pulled up to VDD through separate but similar paths. The device M8 is sized relative to M10 so that the body of M1 at node C is held to approximately the same voltage level as the body of M3 in the off state of the CMOS switch 300. The PMOS devices M5 and M8 form a hold circuit which holds the voltage of node C at about the same voltage as the voltage of the body of M3 during the off state.

Since the two body diodes of M1 and M3 are made using the same diffusions and they have nearly the same reversed biased voltage across them, the ratio of the leakage currents IL3 to IL1 are about the same as the ratio of their areas and perimeters. In one embodiment, the devices M3 and M4 are each reduced-size replicas of M1. In this manner, the leakage current IL3 of M3 into switch terminal A is proportional to the leakage current IL1 of M1 into switch terminal A. This ratio can be made more precise by using a standard cell to build both devices. The separate paths for the two leakage currents, M10 for IL3 versus M8 for IL1 allows the leakage current IL3 flowing out of the drain of M3 to be mirrored downward into a mirror current IM1 using current mirror M10 and M9, which current is mirrored again by current mirror M11 and M12 into a mirror current IM2. The current mirror M11 and M12 thus pulls or sinks the mirror current IM2 from terminal A.

The mirrored current IM2 is gained up by the appropriate amount to be approximately equal to the sum of the leakage currents IL1 and IL3, or IM2≈IL1+IL3 (where "≈" denotes an approximation such that IM2 is approximately equal to the sum of IL1+IL3). The area ratios of M9 to M10 and M12 to M11 are selected so that the gained up mirror current IM2 pulled out of terminal A through the drain of M12 is approximately equal to the sum of the leakage currents IL1 and IL3 sourced into terminal A. In this manner, if the leakage current into node A is approximately equal to the mirrored current pulled out of node A, then the resultant leakage current actually seen at terminal A is substantially reduced. Thus, the current IM2 is a cancellation current for the leakage currents IL1 and IL3. Although the leakage current may not actually be eliminated, a large portion of the leakage current is rerouted away from terminal A to GND. If IL1 is about equal to some multiple "M" times IL3, or IL1≈M*IL3 (in which an asterisk "*" denotes multiplication), then the collective current mirror gain is M+1 so that IM2≈(M+1)IL3. As an example, if the level IL3 is selected to be approximately ⅛ times the level of IL1 (or 48*IL3≈IL1), then the area ratios of M9 to M10 and M12 to M11 are chosen for a collective gain of the current mirrors M9, M10 and M11, M12 to multiply IL3 by approximately 48+1=49. In this case, the gains of the current mirrors M9, M10 and M11, M12 (determined by area ratios of the current mirrors) may both be made equal to about 7. In this manner, IM1≈7*IL3 and IM2≈7*IM1 so that IM2≈49*IL3≈IL1+IL3. Of course, the gains of the individual current mirrors may be different so long as the collective gain provides suitable current cancellation.

The leakage current for the B terminal is canceled the same way using a different set of transistors, M4, and M13 through M16. As shown, M4 has a leakage current IL4 which is proportional to the body to drain leakage current IL2 of M1. The hold circuit including devices M5 and M8 hold the voltage of the body of M1 to about the same voltage as the body of M4. The two body diodes of M1 and M4 are also made using the same diffusions and have nearly the same reversed biased voltage across them, so that the ratio of the leakage currents IL4 to IL2 are about the same as the ratio of their areas and perimeters. The proportionate leakage current IL4 is mirrored and amplified by current mirror M13, M14 to generate mirror current IM3 sourced from the drain of M14. The mirror current IM3 is mirrored and amplified by current mirror M15, M16 to generate mirror current IM4 flowing out of switch terminal B into the drain of M15. In a similar manner as described above, the area ratios of M14 to M13 and of M15 to M16 are chosen such that IM4≈IL2+IL4. If IL2 is about equal to some multiple "M" times IL4, or IL2≈M*IL4, then the collective current mirror gain is M+1 so that IM4≈(M+1)IL4. In this manner, the current IM4 is a cancellation current for the leakage currents IL2 and IL4. Since the leakage current on terminal A is canceled independently of the current on terminal B, terminals A and B can be held at different voltages while canceling leakage current in a similar manner for both terminals.

Figure 4:
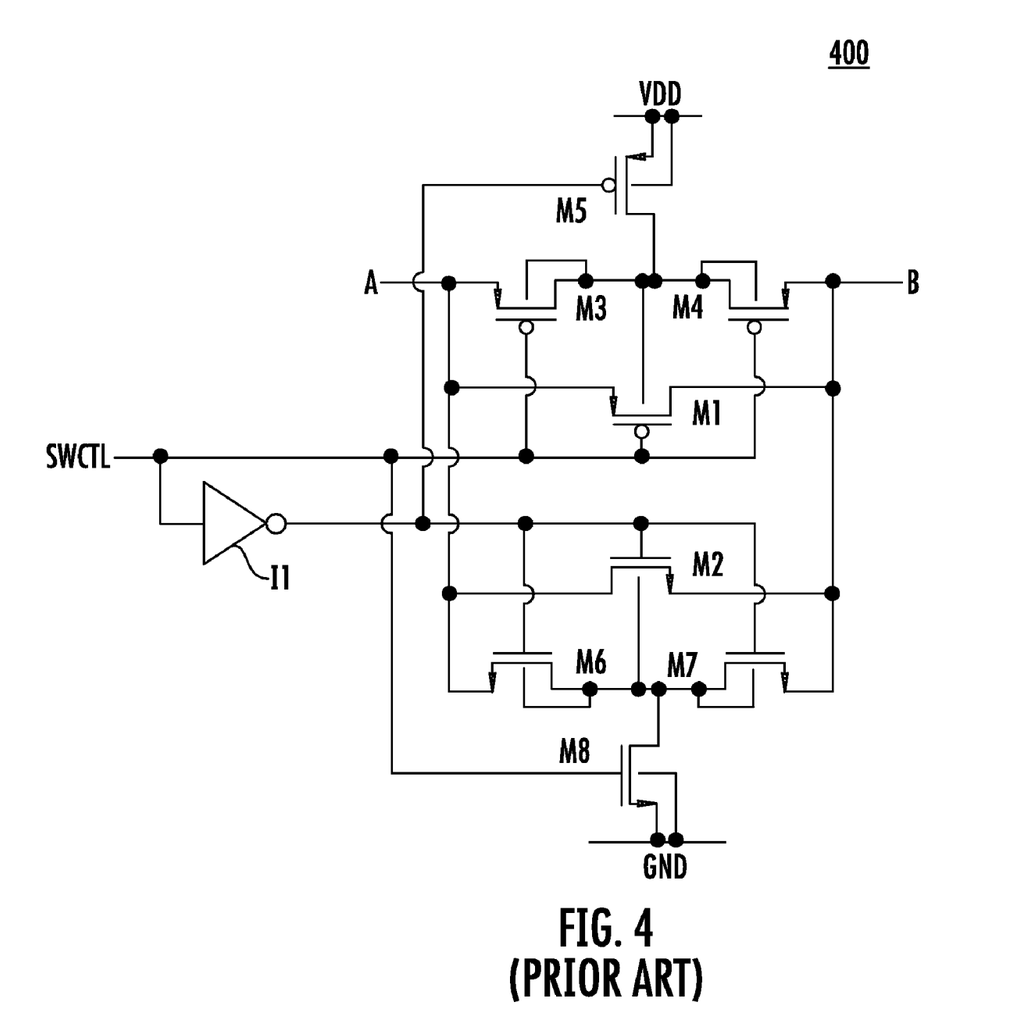
FIG. 4 is a CMOS switch implemented according to prior art manufactured in a CMOS process that utilizes a twin or triple well CMOS process.

FIG. 4 is a CMOS switch 400 implemented similar to the CMOS switch 200 according to prior art except manufactured in a CMOS process that utilizes a twin or triple well CMOS process. For the twin or triple well CMOS process (or multiple well process) where the bodies of the NMOS devices are also isolated from the substrate, the leakage current of the N-type switch may also be reduced. The devices M1-M5 are included and coupled in substantially identical manner as the CMOS switch 200 between terminals A and B as controlled by the SWCTL signal. The CMOS switch 400, however, includes three additional devices M6, M7, and M8. The devices M6-M8 operate with respect to the NMOS device M2 in the NMOS half in an analogous manner as the devices M3-M5 operate with respect to the PMOS device M1 on the PMOS half. The purpose of devices M6-M8 in this case is to alter the body voltage of M2 depending on which state the CMOS switch 400 is in. This is done to improve the on state and off state characteristics of M2. In the on state when SWCTL is pulled low, M6 and M7 are turned on and M8 is turned off. This pulls the body of M2 close to the midpoint of the voltages applied to terminals A and B. This is analogous to the function of M3 and M4 on the PMOS half of the circuit. During the off state when SWCTL is pulled high, M6 and M7 are turned off and M8 is turned on. This pulls the body of M2 towards ground which helps to maintain the off impedance of M2. This is analogous to the function of M5 on the PMOS half of the circuit. In fact, it is understood that the NMOS and PMOS halves of the CMOS switch 400 are basically complements of each other.

During the off state of the CMOS switch 400 when SWCTL is high, the devices M1-M4 are turned off and M5 is turned on. The leakage currents are similar to that described above for the CMOS switch 200 in which the leakage current of the largest PMOS device, M1, is typically the dominant term. In a similar manner, during the off state of the CMOS switch 400, the devices M6 and M7 are turned off and M8 is turned on. M8 pulls the bodies of M2, M6, and M7 down to GND to help keep these devices in the off state. However, this reverse biases the drain or source to bodies of M2, M6, and M7. The N-doped cathodes of both body diodes of M2 and of the body diodes of the sources of M6 and M7 are coupled to either one of the switch terminals A and B. The leakage current on terminals A or B during the on state is the sum of all of these leakage currents, which can be 1 or 2 orders of magnitude larger than the on state leakage current of these same devices. The drain to body leakage current of the largest NMOS device, M2, is typically the dominant term in this sum. As described further below, however, leakage current cancellation during the off state for the CMOS switch 400 may be accomplished in a similar manner as that shown and described for the CMOS switch 300. Additional transistors are provided to cancel out the new components to the leakage current added by the drain to body and the source to body diodes of device M2. This is done by creating a complement of the PMOS cancellation circuit of the CMOS switch 300 and using it to cancel the added NMOS leakage currents.

Figure 5:
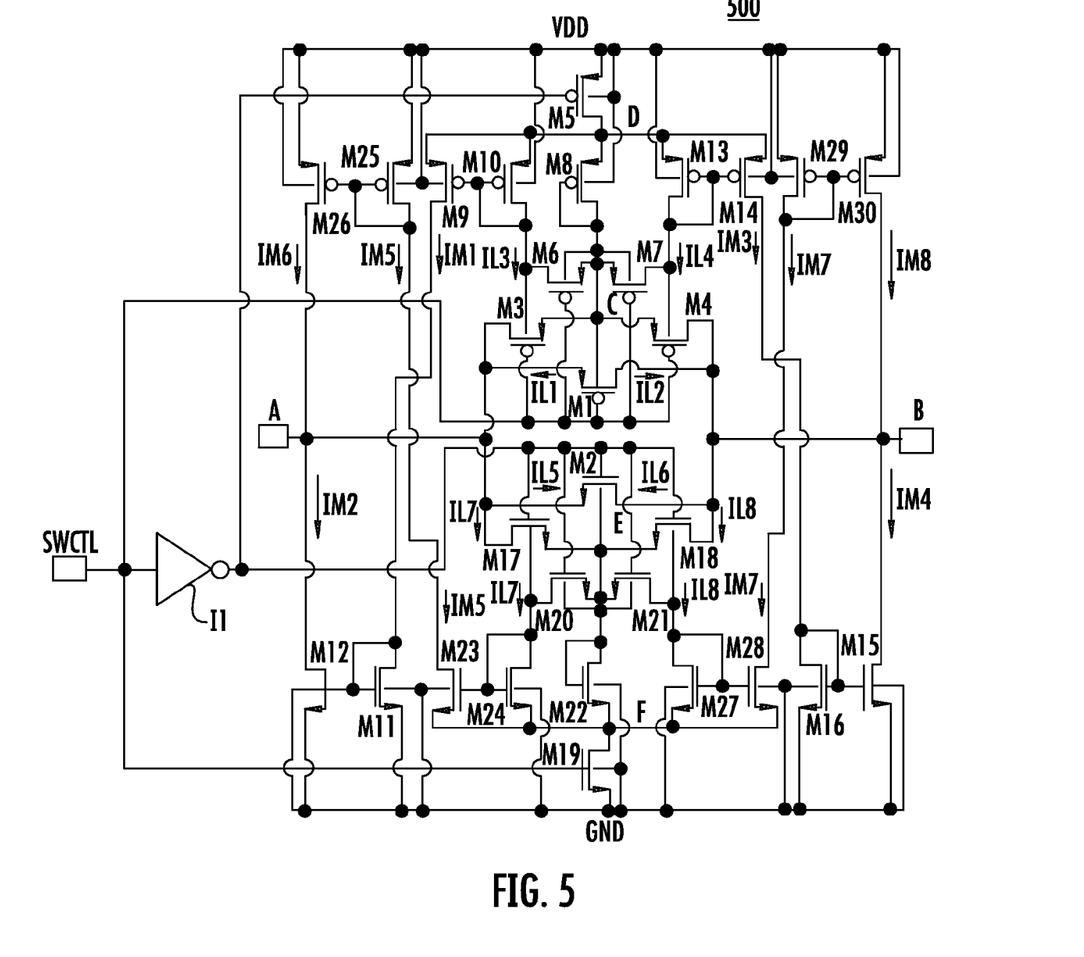
FIG. 5 is a schematic diagram of a CMOS switch implemented according to another embodiment manufactured in a CMOS process that utilizes a twin or triple well CMOS process.

FIG. 5 is a schematic diagram of a CMOS switch 500 implemented according to another embodiment manufactured in a CMOS process that utilizes a twin or triple well CMOS process. The inverter I1 and the devices M1 and M3-M16 are coupled in substantially identical manner to the switch terminals A and B as controlled by the SWCTL signal as the CMOS switch 300. It is noted that in some cases the drain and source are shown reversed; it is understood, however, that the drains and sources are extended resulting in symmetrical devices so that the drain and sources are interchangeable. M2 is coupled in a similar manner with its source coupled to A, its drain coupled to B, and its gate coupled to the output of the inverter I1. The body of M2, however, is instead coupled to a node E. Additional NMOS devices M17-M24, M27, and M28 and PMOS devices M25, M26, M29 and M30 are included for canceling the leakage currents of M2. Devices M17, M18 correspond with devices M3, M4. Devices M20, M21 correspond with devices M6, M7. Devices M19, M22 correspond with devices M5, M8. A current mirror circuit comprising devices M23, M24, M25 and M26 corresponds with the current mirror circuit of devices M9, M10, M11 and M12. Similarly, a current mirror circuit comprising devices M27, M28, M29 and M30 corresponds with the current mirror circuit of devices M13, M14, M15 and M16. As noted above, just as for the additional devices M3-M16, the additional devices M17-M30 are substantially smaller than the large switch devices M1 and M2 so that the overall size of the CMOS switch is not appreciably increased.

As shown, the sources of devices M17, M18, M20 and M21 and the bodies of M20 and M21 are all coupled to node E. The drain of M17 is coupled to switch terminal A and the drain of M18 is coupled to switch terminal B. The gates of M17, M18, M20 and M21 are coupled to the output of the inverter I1. The body of M17 is coupled to the drain of M20 and to the drain and gate of M24. The body of M18 is coupled to the drain of M21 and to the drain and gate of M27. The drain and gate of M22 are coupled together at node E. The sources of devices M22, M23, M24, M27 and M28 are coupled to another intermediate node F and the bodies of devices M22, M23, M24, M27 and M28 are coupled to GND. The drain of M19 is coupled to node F, the source and body of M19 are coupled to GND, and the gate of M19 receives the SWCTL signal. The gate of M23 is coupled to the gate of M24 in a mirror configuration. The gate of M28 is coupled to the gate of M27 in a mirror configuration. PMOS devices M25 and M26 are coupled in a current mirror configuration having their bodies and sources coupled to VDD and their gates coupled together. The gate of M25 is coupled to its drain, to the gate of M26 and to the drain of M23. The drain of M26 is coupled to terminal A. PMOS devices M29 and M30 are coupled in a current mirror configuration having their bodies and sources coupled to VDD and their gates coupled together. The gate of M29 is coupled to its drain, to the gate of M30 and to the drain of M28. The drain of M30 is coupled to terminal B.

The basic operation of the CMOS switch 500 is as follows. The operation of devices M1 and M3-M16 is substantially identical to that described above for the CMOS switch 300. The leakage currents IL1-IL4 are shown along with the mirror currents IM1-IM4 used to cancel the leakage currents for the PMOS half of the circuit. The CMOS switch 500 is in the on state when SWCTL is low, in which devices M2, M17, M18, M20 and M21 are all turned on and devices M19 and M22-M30 are turned off. This connects the bodies of M2, M17, M18, M20, and M21 to the midpoint of the voltages applied to switch terminals A and B in the same manner as is done in the CMOS switch 300 for the device M1. During the off state when SWCTL is high, devices M2, M17, M18, M20, M21 are turned off and M19 and M22-M30 are turned on. The body of M2 is pulled low towards GND through M19 and M22. In a similar manner as described above, the two body diodes of M2 and the corresponding body diodes of M17 and M18 have nearly the same reversed biased voltage across them in the off state of the CMOS switch 500. The devices M19 and M22 collectively form a hold circuit similar to the devices M5 and M8 to hold the voltage of node E at about the same voltage as the bodies of M17 and M18. A first leakage current IL5 flows from switch terminal A through the source and body of M2 and a second leakage current IL6 flows from switch terminal B through the drain and body of M2. The source and drain leakage currents IL5 and IL6 vary independent of each other depending on the voltages applied to terminals A and B. The body of M17 is also pulled low towards GND through M19 and M24 causing a leakage current IL7. Again, the body to drain diode of M17 has almost the same voltage across it as the body to source diode of M2 in which the cathodes of both reversed-biased diodes are coupled to terminal A. Since these two body diodes are made using the same diffusions and they have nearly the same reversed biased voltage across them, the ratio of leakage currents IL5 to IL7 is about the same as the ratio of their areas and perimeters. Thus, the leakage current IL7 is proportional to the leakage current IL5. This ratio can be made more precise by using a standard cell to build both devices. The separate paths for the two leakage currents, M24 for IL7 versus M22 for IL5, allows the leakage current IL7 to be mirrored by the current mirror M24, M23 into a mirror current IM5 flowing into the drain of M23. The mirror current IM5 is mirrored again by current mirror M25, M26 providing a mirror current IM6 flowing out of the drain of M26 into the switch terminal A. The area ratios of M23 to M24 and M26 to M25 are selected to amplify the mirrored current so that IM6≈IL5+IL7. If the magnitude of IL5 is some multiple M times the magnitude of IL7, then the current mirrors collectively amplify the leakage current IL7 by M+1 so that IM6≈(M+1)IL7≈IL5+IL7 in a similar manner previously described. In this manner, the mirrored and amplified current IM6 provided into terminal A is a cancellation current which cancels the collective leakage current IL5+IL7 pulled out of terminal A.

The leakage current for the B terminal is canceled in a similar manner. The body to drain diode of M2 causes a leakage current IL6 to be drawn from switch terminal B. The device M18 is provided having a proportionate body to drain diode which is reversed biased by the same amount to draw a proportionate leakage current IL8. The leakage current IL8 is mirrored and amplified by current mirror M27, M28 to provide mirror current IM7 flowing into the drain of M28. The mirror current IM7 is mirrored and amplified by the current mirror M29, M30 into mirror current IM8 flowing out of the drain of M30 and back into the switch terminal B. The area ratios of M28 to M27 and M30 to M29 are selected to amplify the mirrored current so that IM8≈IL6+IL8. If the magnitude of IL6 is some multiple M times the magnitude of IL8, then the current mirrors collectively amplify the leakage current IL8 by M+1 so that IM8≈(M+1)IL8≈IL6+IL8 in a similar manner previously described. In this manner, the mirrored and amplified current IM8 provided into terminal B is a cancellation current which cancels the collective leakage current IL6+IL8 pulled out of terminal B.

Since the leakage current on terminal A is canceled independently of the current on terminal B, terminals A and B can be held at different voltages while canceling leakage current in a similar manner for both terminals. It may appear that the leakage currents IL5 and IL6 pulled out of the switch terminals A and B, respectively, by M2 might provide some level of cancellation for the leakage currents IL1 and IL2 provided into respective switch terminals A and B by M1. It is noted, however, that such current symmetry is not automatically achieved and such currents are not consistent from one integrated process to the next. In this manner, these independent leakage currents are independently canceled to minimize resulting leakage current in the off state of the CMOS switch 500.

An integrated analog switch according to one embodiment includes first and second semiconductor devices and a current mirror. Each semiconductor device has first and second current terminals (e.g., drain and source), a control terminal (e.g., a gate), and a body. The body for both semiconductor devices is isolated from its substrate. For example, the semiconductor devices may be PMOS devices for a single well process or either PMOS or NMOS for multiple well processes. The first semiconductor device is used as a switching device and has first and second current terminals coupled between first and second switch terminals. Additional semiconductor switching devices may be coupled in parallel to reduce the on resistance between the switch terminals. When turned off, the body of the first semiconductor device is pulled to a bias voltage or the like to ensure that it is turned off. When turned off, however, the first semiconductor device causes a first leakage current between its body and the first switch terminal via its first current terminal. The leakage current flows through the reverse-biased body diode between the body and the current terminal.

Each switching device, including the first semiconductor device, is made very large to reduce the on resistance between the switching terminals. The second semiconductor device, however, is substantially smaller than the first semiconductor device. The first and second current terminals of the second switching device are coupled to the first switching terminal and the body of the first semiconductor device, respectively. The second semiconductor device is generally a reduced-size replica of the first semiconductor device. Both devices are turned off by the same switch control signal, and the body of the second device is pulled to about the same bias voltage as the body of the first semiconductor device when both are turned off. In this manner, the second semiconductor device provides a second leakage current between its body and the first switch terminal via its first current terminal. Since the second semiconductor device is similar to the first in construction and biasing, albeit significantly smaller, the second leakage current is proportional to the first leakage current.

The current mirror circuit is coupled to the first switch terminal and to the body of the second semiconductor device. The current mirror circuit mirrors and amplifies the second leakage current to provide a cancellation current which is applied to the first switch terminal. The cancellation current is equivalent to a sum of the first and second leakage currents, so that leakage current is minimized. For example, of the first leakage current is a multiple of the second leakage current, then the current mirror circuit amplifies the magnitude of the second leakage current by the multiple plus one and applies the resulting cancellation current to the first switch terminal to cancel leakage current. The leakage current is effectively re-routed to a voltage source node.

A third semiconductor device may be included along with another current mirror circuit to cancel a leakage current between the body and second current terminal of the first semiconductor device. In this case the additional leakage current of the first semiconductor device is applied to the second switching terminal, and the additional current mirror circuit applies a second cancellation current to the second switch terminal to cancel this additional leakage current. It is noted that the use of separate second and third semiconductor devices enable independent cancellation of the leakage currents of the first semiconductor device.

The integrated analog switch may include another semiconductor switching device having current terminals coupled in parallel with the first semiconductor device. The additional semiconductor switching device is also very large to further reduce on resistance. The additional semiconductor switching device operates in substantially similar manner as the first semiconductor device and generates leakage currents via the first and second switching terminals. Additional reduced-size replicas of the additional semiconductor switching device along with corresponding current mirror circuits are included to cancel the additional leakage currents in substantially the same manner. In one embodiment, for example, the first and second semiconductor devices are PMOS devices whereas the additional semiconductor switching device and its additional reduced-size replicas are NMOS devices.

Although the present invention has been described in considerable detail with reference to certain preferred versions thereof, other versions and variations are possible and contemplated. For example, circuits or logic blocks described herein may be implemented as discrete circuitry or integrated circuitry or software or any alternative configurations. Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

The invention claimed is:

1. An integrated analog switch, comprising:
   a first semiconductor device having first and second current terminals, a control terminal and a body, wherein said first and second current terminals are coupled to first and second switch terminals, respectively;
   wherein said first semiconductor device, when turned off, causes a first leakage current between said body of said first semiconductor device and said first switch terminal;
   a second semiconductor device comprising first and second current terminals, a control terminal and a body, wherein said first current terminal of said second semiconductor device is coupled to said first switch terminal and wherein said second current terminal of said second semiconductor device is coupled to said body of said first semiconductor device;
   wherein said second semiconductor device, when turned off, causes a second leakage current between said body of said second semiconductor device and said first switch terminal, wherein said second leakage current is proportional to said first leakage current; and
   a first current mirror circuit, coupled to said first switch terminal and to said body of said second semiconductor device, which mirrors and amplifies said second leakage current to provide a first cancellation current which is applied to said first switch terminal, wherein said first cancellation current is equivalent to a sum of said first and second leakage currents.

2. The integrated analog switch of claim 1, further comprising:
   a hold circuit coupled to said body of said first semiconductor device, wherein said hold circuit pulls said body of said first semiconductor device towards a first voltage when said first semiconductor device is turned off; and
   wherein said first current mirror circuit pulls said body of said second semiconductor device towards said first voltage when said second semiconductor device is turned off.

3. The integrated analog switch of claim 2, wherein:
   said first current mirror circuit develops a voltage difference between an intermediate node and said body of said second semiconductor device when said second semiconductor device is turned off; and
   wherein said hold circuit comprises:
      a third semiconductor device coupled between a source voltage node and said intermediate node, wherein said third semiconductor device is turned on when said first semiconductor device is turned off; and
      a fourth semiconductor device coupled between said intermediate node and said body of said first semiconductor device, wherein said fourth semiconductor device is turned on when said third semiconductor device is turned on, and wherein said fourth semiconductor device is sized to develop said voltage difference between said intermediate node and said body of said first semiconductor device when said first semiconductor device is turned off.

4. The integrated analog switch of claim 1, wherein said first current mirror circuit comprises:
   a first half mirror circuit, coupled to said body of said second semiconductor device and to a first source voltage node, which develops a first mirror current proportional to said second leakage current; and
   a second half mirror circuit, coupled to a second source voltage node, to said first half mirror circuit for sensing said first mirror current, and to said first switch terminal, which develops said first cancellation current proportional to said first mirror current and which applies said first cancellation current to said first switch terminal.

5. The integrated analog switch of claim 1, wherein said first leakage current is a multiple of said second leakage current and wherein said first current mirror circuit amplifies said second leakage current by said multiple plus one.

6. The integrated analog switch of claim 1, further comprising:
   said first semiconductor device, when turned off, providing a third leakage current between said body of said first semiconductor device and said second switch terminal;
   a third semiconductor device comprising first and second current terminals, a control terminal and a body, wherein said first current terminal of said third semiconductor device is coupled to said second switch terminal and wherein said second current terminal of said third semiconductor device is coupled to said body of said first semiconductor device;
   wherein said third semiconductor device, when turned off, provides a fourth leakage current between said body of said third semiconductor device and said second switch terminal, wherein said fourth leakage current is proportional to said third leakage current; and
   a second current mirror circuit, coupled to said second switch terminal and to said body of said third semiconductor device, which mirrors and amplifies said fourth leakage current to provide a second cancellation current applied to said second switch terminal, wherein said second cancellation current is equivalent to a sum of said third and fourth leakage currents.

7. The integrated analog switch of claim 6, wherein said third and fourth leakage are independent of each other providing independent cancellation of said first and third leakage currents of said first semiconductor device.

8. An integrated MOS switch, comprising:
   a first MOS device having first and second current terminals coupled to first and second switch terminals, respectively, a control terminal receiving a first switch control signal, and a body, wherein said first MOS device provides a first leakage current between said body and said first switch terminal and a second leakage current between said body and said second switch terminal when said first MOS device is turned off by said first switch control signal;
   a second MOS device having a first current terminal coupled to said first switch terminal, a second current terminal coupled to said body of said first MOS device, a control terminal receiving said first switch control signal, and a body, wherein said second MOS device provides a third leakage current between said body and said first switch terminal when said second MOS device is turned off by said first switch control signal;
   a third MOS device having a first current terminal coupled to said second switch terminal, a second current terminal coupled to said body of said first MOS device, a control terminal receiving said first switch control signal, and a body, wherein said third MOS device provides a fourth leakage current between said body and said second switch terminal when said third MOS device is turned off by said first switch control signal;
   a first hold circuit which holds said body of said first MOS device to a first voltage when said first MOS device is turned off by said first switch control signal;
   a first mirror circuit which holds said body of said second MOS device to said first voltage when said second MOS device is turned off by said first switch control signal, and which applies a first cancellation current to said first switch terminal to cancel said first and third leakage currents based on mirroring and amplifying said third leakage current; and
   a second mirror circuit which holds said body of said third MOS device to said first voltage when said third MOS device is turned off by said first switch control signal, and which applies a second cancellation current to said second switch terminal to cancel said second and fourth leakage currents based on mirroring and amplifying said fourth leakage current.

9. The integrated MOS switch of claim 8, wherein said first leakage current is a first multiple times said third leakage current, wherein said first mirror circuit amplifies said third leakage current by said first multiple plus one to provide said first cancellation current, wherein said second leakage current is a second multiple times said fourth leakage current, and wherein said second mirror circuit amplifies said fourth leakage current by said second multiple plus one to provide said second cancellation current.

10. The integrated MOS switch of claim 8, wherein said first, second, and third MOS devices comprise P-type MOS devices manufactured in a complementary MOS process that utilizes a single well substrate.

11. The integrated MOS switch of claim 8, wherein said first, second, and third MOS devices comprise N-type MOS devices manufactured in a complementary MOS process that utilizes a multiple well substrate.

12. The integrated MOS switch of claim 8, wherein said first hold circuit comprises:
   a fourth MOS device having a first current terminal and a body coupled to a first source voltage node, a second current terminal coupled to an intermediate node, and a control terminal receiving a second switch control signal having an opposite logic state as said first switch control signal; and
   a fifth MOS device having a first current terminal coupled to said intermediate node, a body coupled to said first source voltage node, and a control terminal and second current terminal coupled to said body of said first MOS device.

13. The integrated MOS switch of claim 12, wherein said first mirror circuit comprises:
   a sixth MOS device having a first current terminal coupled to said intermediate node, a body coupled to said first source voltage node, and a control terminal and second current terminal coupled to said body of said second MOS device;
   a seventh MOS device having a first current terminal coupled to said intermediate node, a body coupled to said first source voltage node, a control terminal coupled to said control terminal of said sixth MOS device, and a second current terminal;
   an eighth MOS device having a first current terminal and a control terminal coupled to said second current terminal of said seventh MOS device, and a second current terminal and a body coupled to a second source voltage node; and a ninth MOS device having a first current terminal coupled to said first switch terminal, a control terminal coupled to said control terminal of said eighth MOS device, and a second current terminal and a body coupled to said second source voltage node.

14. The integrated MOS switch of claim 13, wherein said second mirror circuit comprises:

a tenth MOS device having a first current terminal coupled to said intermediate node, a body coupled to said first source voltage node, and a control terminal and second current terminal coupled to said body of said third MOS device;

an eleventh MOS device having a first current terminal coupled to said intermediate node, a body coupled to said first source voltage node, a control terminal coupled to said control terminal of said tenth MOS device, and a second current terminal;

a twelfth MOS device having a first current terminal and a control terminal coupled to said second current terminal of said eleventh MOS device, and a second current terminal and a body coupled to said second source voltage node; and a thirteenth MOS device having a first current terminal coupled to said second switch terminal, a control terminal coupled to said control terminal of said twelfth MOS device, and a second current terminal and body coupled to said second source voltage node.

15. The integrated MOS switch of claim 14, further comprising:

a fourteenth MOS device having a control terminal receiving said first switch control signal, a first current terminal coupled to said body of said second MOS device, and a second current terminal and a body coupled to said body of said first MOS device; and a fifteenth MOS device having a control terminal receiving said first switch control signal, a first current terminal coupled to said body of said third MOS device, and a second current terminal and a body coupled to said body of said first MOS device.

16. The integrated MOS switch of claim 15, wherein:

said first leakage current of said first MOS device is a first multiple of said third leakage current of said second MOS device, and wherein sizes of said sixth, seventh, eighth, and ninth MOS devices of said first mirror circuit are selected to amplify said third leakage current by said first multiple plus one to provide said first cancellation current; and wherein said second leakage current of said first MOS device is a second multiple of said fourth leakage current of said third MOS device, and wherein sizes of said tenth, eleventh, twelfth, and thirteenth MOS devices of said second mirror circuit are selected to amplify said fourth leakage current by said second multiple plus one to provide said second cancellation current.

17. The integrated MOS switch of claim 15, wherein said sixth and tenth MOS devices have approximately the same size to hold said bodies of said second and third MOS devices to said first voltage when said second and third MOS devices are turned off, and wherein a size of said fifth MOS device is selected to hold said body of said first device to said first voltage when said first MOS device is turned off.

18. The integrated MOS switch of claim 8, further comprising:

a fourth MOS device having first and second current terminals coupled to first and second switch terminals, respectively, a control terminal receiving a second switch control signal having an opposite logic state as said first switch control signal, and having a body, wherein said fourth MOS device provides a fifth leakage current between said body of said fourth MOS device and said first switch terminal and a sixth leakage current between said body of said fourth MOS device and said second switch terminal when said fourth MOS device is turned off by said second switch control signal;

a fifth MOS device having a first current terminal coupled to said first switch terminal, a second current terminal coupled to said body of said fourth MOS device, a control terminal receiving said second switch control signal, and a body, wherein said fifth MOS device provides a seventh leakage current between said body of said fifth MOS device and said first switch terminal when said fifth MOS device is turned off by said second switch control signal;

a sixth MOS device having a first current terminal coupled to said second switch terminal, a second current terminal coupled to said body of said fourth MOS device, a control terminal receiving said second switch control signal, and a body, wherein said sixth MOS device provides an eighth leakage current between said body of said sixth MOS device and said second switch terminal when said sixth MOS device is turned off by said second switch control signal;

a second hold circuit which holds said body of said fourth MOS device to a second voltage when said fourth MOS device is turned off by said second switch control signal;

a third mirror circuit which holds said body of said fifth MOS device to said second voltage when said fifth MOS device is turned off by said second switch control signal, and which applies a third cancellation current to said first switch terminal to cancel said fifth and seventh leakage currents based on mirroring and amplifying said seventh leakage current; and a fourth mirror circuit which holds said body of said sixth MOS device to said second voltage when said sixth MOS device is turned off by said second switch control signal, and which applies a fourth cancellation current to said second switch terminal to cancel said sixth and eighth leakage currents based on mirroring and amplifying said sixth leakage current.

19. A method of canceling a leakage current of an integrated analog switch, wherein the integrated analog switch comprises a first semiconductor device having first and second current terminals coupled to first and second switch terminals, respectively, a body and a control terminal receiving a switch control signal, wherein the leakage current is developed through the body and the first current terminal when the first semiconductor switch device is turned off and when the body is pulled to a bias voltage level, said method comprising:

providing a second semiconductor device being a reduced-size replica of the first semiconductor device, wherein the second semiconductor device has first and second current terminals, a control terminal and a body;

providing the switch control signal to the control terminal of the second semiconductor device;

coupling the first current terminal of the second semiconductor device to the first current terminal of the first semiconductor device and coupling the second current terminal of the second semiconductor device to the body of the first semiconductor device;

pulling the body of the second semiconductor device to the bias voltage level when the first and second semiconductor devices are both turned off by the switch control signal, wherein the second semiconductor device develops a proportional current between the first current terminal and body of the second semiconductor device and wherein the proportional current is proportional to the leakage current of the first semiconductor device;

mirroring and amplifying the proportional current to provide a cancellation current; and applying the cancellation current to the first switch terminal.

20. The method of claim 19, wherein said pulling comprises:
   providing a third semiconductor device coupled to the body of the first semiconductor device; and
   providing a fourth semiconductor device coupled to the body of the second semiconductor device and having a size selected for pulling the body of the second semiconductor device to the bias voltage level when the second semiconductor device is turned off.

21. The method of claim 19, wherein said amplifying comprises amplifying the proportional current so that the cancellation current is equivalent to a sum of the leakage current of the first semiconductor device and the proportional current of the second semiconductor device.

* * * * *